United States Patent
Miyazawa

(10) Patent No.: US 10,505,382 B2
(45) Date of Patent: Dec. 10, 2019

(54) SWITCH APPARATUS

(71) Applicant: FUJI ELECTRIC CO., LTD., Kanagawa (JP)

(72) Inventor: Shigemi Miyazawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 427 days.

(21) Appl. No.: 15/364,263

(22) Filed: Nov. 30, 2016

(65) Prior Publication Data

US 2017/0207650 A1    Jul. 20, 2017

(30) Foreign Application Priority Data

Jan. 15, 2016  (JP) .................. 2016-006367

(51) Int. Cl.
  *H02J 7/00* (2006.01)
  *H03K 17/0812* (2006.01)
  *H03K 17/082* (2006.01)
  *F02P 3/045* (2006.01)
  *H03K 17/08* (2006.01)

(52) U.S. Cl.
  CPC .......... *H02J 7/0068* (2013.01); *F02P 3/0453* (2013.01); *H03K 17/0822* (2013.01); *H03K 17/08122* (2013.01); *H03K 2017/0806* (2013.01); *H03K 2217/0081* (2013.01)

(58) Field of Classification Search
  CPC ............ H02J 7/0068; H03K 17/0822; H03K 17/08122; H03K 2217/0081; H03K 2017/0806; F02P 3/05
  See application file for complete search history.

(56) References Cited

U.S. PATENT DOCUMENTS

| | | | |
|---|---|---|---|
| 3,944,860 A | 3/1976 | Moore | |
| 4,030,468 A | 6/1977 | Sugiura | |
| 4,452,199 A | 6/1984 | Andreasson | |
| 4,758,790 A * | 7/1988 | Hunt ................... | F02P 17/00 324/379 |

(Continued)

FOREIGN PATENT DOCUMENTS

| | | |
|---|---|---|
| JP | S5664158 A | 6/1981 |
| JP | S57173559 A | 10/1982 |

(Continued)

OTHER PUBLICATIONS

Notice of First Office Action for Patent Application No. 201611095547. X, issued by The State Intellectual Property Administration of the People's Republic of China dated Sep. 12, 2019.

*Primary Examiner* — Pinping Sun

(57) ABSTRACT

A drive circuit that operates stably and has a small circuit size. Provided is a switch apparatus including a power semiconductor element connected between a first terminal on a high potential side and a second terminal on a low potential side; a capacitor; a charging section that charges the capacitor for at least a portion of an interval during which the power semiconductor element is OFF; a discharging section that causes the capacitor to gradually discharge, in response to the power semiconductor element becoming ON; and a cutoff section that sets the power semiconductor element to an OFF state, in response to a voltage of the capacitor becoming lower than a threshold voltage.

18 Claims, 10 Drawing Sheets

(56) References Cited

U.S. PATENT DOCUMENTS

| | | | | |
|---|---|---|---|---|
| 6,336,448 | B1* | 1/2002 | Furuhata | F02P 3/053 |
| | | | | 123/644 |
| 7,242,560 | B2* | 7/2007 | Nair | H03K 17/0822 |
| | | | | 361/54 |
| 8,648,578 | B2* | 2/2014 | Zhao | G05F 1/571 |
| | | | | 323/226 |
| 10,224,920 | B2* | 3/2019 | Volke | H02M 1/088 |
| 2006/0022609 | A1* | 2/2006 | Yukutake | F02P 3/0552 |
| | | | | 315/209 T |
| 2006/0077000 | A1* | 4/2006 | Goudo | H03K 17/08122 |
| | | | | 327/434 |
| 2008/0122500 | A1* | 5/2008 | Suzuki | G06F 1/24 |
| | | | | 327/143 |
| 2010/0263644 | A1* | 10/2010 | Matsuda | F02P 9/005 |
| | | | | 123/625 |
| 2010/0315017 | A1* | 12/2010 | Yu | H02M 1/36 |
| | | | | 315/291 |
| 2011/0063880 | A1* | 3/2011 | Mayell | H02M 1/40 |
| | | | | 363/21.18 |
| 2012/0170335 | A1* | 7/2012 | Lee | H02M 3/156 |
| | | | | 363/89 |
| 2013/0027990 | A1* | 1/2013 | Baurle | H02M 3/33507 |
| | | | | 363/21.17 |
| 2013/0241609 | A1* | 9/2013 | Miyazawa | H03K 3/57 |
| | | | | 327/142 |

FOREIGN PATENT DOCUMENTS

| | | |
|---|---|---|
| JP | S61187576 A | 8/1986 |
| JP | 2002-4991 A | 1/2002 |

* cited by examiner

SWITCH APPARATUS

The contents of the following Japanese patent application are incorporated herein by reference:
NO. 2016-006367 filed on Jan. 15, 2016.

BACKGROUND

1. Technical Field

The present invention relates to a switch apparatus.

2. Related Art

Conventionally, a power semiconductor device that handles a large amount of power is known as a switch apparatus used for ignition in an internal combustion engine, for example. A circuit driving such a power semiconductor device is known that uses a timer circuit or the like to detect when an abnormal state such as excessive current, overheating, or the like occurs in the power semiconductor device and includes a circuit that protects the internal combustion engine from the effects of such abnormalities, such as shown in Patent Documents 1 and 2, for example.

Patent Document 1: Japanese Patent Application Publication No. 2002-4991
Patent Document 2: Japanese Patent Application Publication No. 2006-109286

The timer circuit that detects abnormalities in the power semiconductor device preferably uses a control signal supplied to a drive circuit of the power semiconductor device as an operating power source, and does not use a specialized power source. In other words, a drive circuit for a power semiconductor device is desired that operates stably and has a small circuit size, without including a power supply input, input circuit, or the like specialized for the timer circuit.

SUMMARY

Therefore, it is an object of an aspect of the innovations herein to provide a switch apparatus, which is capable of overcoming the above drawbacks accompanying the related art. The above and other objects can be achieved by combinations described in the claims. According to a first aspect of the present invention, provided is a switch apparatus comprising a power semiconductor element connected between a first terminal on a high potential side and a second terminal on a low potential side; a capacitor; a charging section that charges the capacitor for at least a portion of an interval during which the power semiconductor element is OFF; a discharging section that causes the capacitor to gradually discharge, in response to the power semiconductor element becoming ON; and a cutoff section that sets the power semiconductor element to an OFF state, in response to a voltage of the capacitor becoming lower than a threshold voltage.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
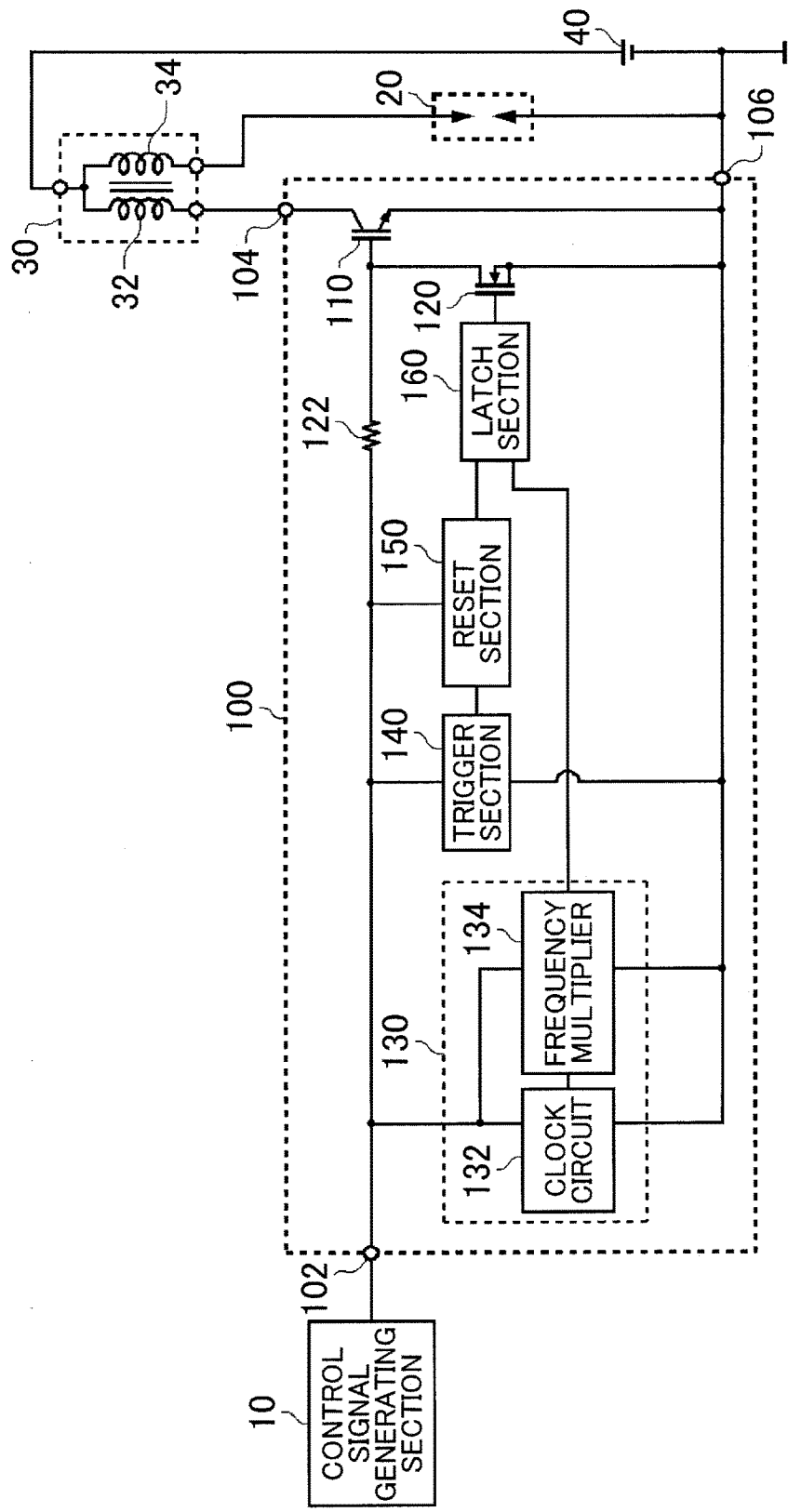
FIG. 1 shows an exemplary configuration of an ignition apparatus 1000 according to an embodiment.

FIG. 1 shows an exemplary configuration of an ignition apparatus 1000 according to an embodiment of the present invention. The ignition apparatus 1000 ignites an ignition plug used in an internal combustion engine or the like of an automobile or the like. The present embodiment is used to describe an example in which the ignition apparatus 1000 is mounted in the engine of an automobile. The ignition apparatus 1000 includes a control signal generating section 10, an ignition plug 20, an ignition coil 30, a power source 40, and a switch apparatus 100.

The control signal generating section 10 generates a control signal that controls the ON and OFF switching of the switch apparatus 100. The control signal generating section 10 is a portion of or all of an engine control unit (ECU) of the automobile in which the ignition apparatus 1000 is mounted, for example. The control signal generating section 10 supplies the switch apparatus 100 with the generated control signal. As a result of the control signal generating section 10 supplying the switch apparatus 100 with the control signal, the ignition apparatus 1000 begins the ignition plug 20 ignition operation.

The ignition plug 20 electrically creates a spark through electrical discharge. The ignition plug 20 performs the electrical discharge using an applied voltage greater than or equal to approximately 10 kV, for example. The ignition plug 20 is provided in an internal combustion engine, as one example, and in this case, ignites a combustion gas such as a mixed gas in a combustion chamber. The ignition plug 20 is provided in a through-hole that penetrates from outside of a cylinder to the combustion chamber inside the cylinder, and is secured by being sealed in the through-hole, for example. In this case, one end of the ignition plug 20 is exposed inside the combustion chamber, and the other end of the ignition plug 20 receives an electrical signal from outside the cylinder.

The ignition coil 30 supplies the electrical signal to the ignition plug. The ignition coil 30 supplies a high voltage causing the ignition plug 20 to discharge, as the electrical signal. The ignition coil 30 may function as a transformer, and is an ignition coil including a primary coil 32 and a secondary coil 34, for example. One end of the primary coil 32 and one end of the secondary coil 34 are electrically connected to each other. The primary coil 32 has a smaller number of windings than the secondary coil 34, and shares a core with the secondary coil 34. The secondary coil 34 generates electromotive force (mutual induced electromotive force) according to the electromotive force generated by the primary coil 32. The other end of the secondary coil 34 is connected to the ignition plug 20, and the secondary coil 34 supplies the ignition plug 20 with the generated electromotive force to cause a discharge.

The power source 40 supplies a voltage to the ignition coil 30. The power source 40 supplies a predetermined constant voltage Vb (14 V, for example) to the one end of the primary coil 32 and the one end of the secondary coil 34, for example. The power source 40 is a battery of the automobile, for example.

The switch apparatus 100 switches whether there is conduction or no conduction between a reference potential and the other end of the primary coil 32 of the ignition coil 30, according to the control signal supplied from the control signal generating section 10. For example, the switch apparatus 100 causes conduction between the reference potential and the primary coil 32 in response to the control signal having a high potential (ON potential), and causes no conduction between the reference potential and the primary coil 32 in response to the control signal having a low potential (OFF potential).

Here, the reference potential may be a reference potential of a control system of the automobile, or may be a reference potential corresponding to the switch apparatus 100 in the automobile. The reference potential may have a low potential to turn OFF the switch apparatus 100, and this low potential is 0 V, for example. The switch apparatus 100 includes a control terminal 102, a first terminal 104, a second terminal 106, a power semiconductor element 110, a cutoff section 120, a resistor 122, a timer circuit 130, a trigger section 140, a reset section 150, and a latch section 160.

The control terminal 102 inputs a control signal for controlling the power semiconductor element 110. The control terminal 102 is connected to the control signal generating section 10, and receives the control signal. The first terminal 104 is connected to the power source 40 via the ignition coil 30. The second terminal 106 is connected to the reference potential. In other words, the first terminal 104 is a terminal on a high potential side compared to the second terminal 106, and the second terminal 106 is a terminal on a low potential side compared to the first terminal 104.

The power semiconductor element 110 includes a gate terminal (G), a collector terminal (C), and an emitter terminal (E), and creates an electrical connection or an electrical disconnection between the collector terminal and the emitter terminal according to the control signal input to the gate terminal. The power semiconductor element 110 is connected between the first terminal 104 on the high potential side and the second terminal 106 on the low potential side, and is controlled to be ON or OFF according to a gate potential. The power semiconductor element 110 is controlled by a gate potential thereof, according to the control signal. The power semiconductor element 110 is an insulated gate bipolar transistor (IGBT), for example. Instead, the power semiconductor element 110 may be a MOSFET.

The power semiconductor element 110 has a withstand voltage reaching several hundred volts, for example. The power semiconductor element 110 is a vertical device in which a collector electrode is formed on a first surface side of a substrate and a gate electrode and emitter electrode are formed on the second surface side, which is opposite the first surface. The power semiconductor element 110 may be a vertical MOSFET. The emitter terminal of the power semiconductor element 110 is connected to the reference potential, for example. The collector terminal is connected to the other end of the primary coil 32. In the present embodiment, an example is described in which the power semiconductor element 110 is an n-channel IGBT that electrically connects the collector terminal and the emitter terminal in response to the control signal having the ON potential.

The cutoff section 120 is connected between a gate terminal of the power semiconductor element 110 and the reference potential. The cutoff section 120 is a FET that is controlled to be ON or OFF between the drain terminal and the source terminal thereof, according to the gate potential, for example. The drain terminal of the cutoff section 120 is connected to the gate terminal of the power semiconductor element 110, the source terminal of the cutoff section 120 is connected to the reference potential, and the cutoff section 120 switches whether the control signal input from the control terminal 102 is supplied to the gate terminal of the power semiconductor element 110. The cutoff section 120 is a normally-OFF switch element that creates an electrical connection between the drain terminal and the source terminal thereof, in response to the gate terminal being a high potential, for example. In this case, the cutoff section 120 is preferably an n-channel MOSFET.

The resistor 122 is connected between the control terminal 102 and the gate terminal of the power semiconductor element 110. The resistor 122 supplies the control signal to the gate terminal of the power semiconductor element 110, when the cutoff section 120 is in the OFF state. The resistor 122 reduces the voltage of the control signal, when the cutoff section 120 is in the ON state and the control signal flows to the reference potential. In other words, the reference potential is supplied to the gate terminal of the power semiconductor element 110.

The timer circuit 130 detects the occurrence of an abnormality in the power semiconductor element 110. The timer circuit 130 measures the time during which the control signal input from the control terminal 102 continues at the high potential, from when this control signal becomes the high potential. When the time during which the control signal continues at the high potential exceeds a predetermined time, the timer circuit 130 continues causing the current to flow to the power semiconductor element 110, determines that an abnormality due to heating or the like has occurred, and outputs information indicating detection of an abnormality as the timer signal. The predetermined time is set as a timer time T. When the high potential is output in response to the detection of an abnormality and the time during which the control signal continues at the high potential is less than or equal to the predetermined time, the timer circuit 130 outputs a low potential, for example. The timer circuit 130 includes a clock circuit 132 and a frequency multiplier 134.

The clock circuit 132 generates a clock signal. The clock circuit 132 operates using the control signal input from the control terminal 102 as a power source. The clock circuit 132 supplies the frequency multiplier 134 with the generated clock signal. The frequency multiplier 134 multiplies the period of the received clock signal. For example, the frequency multiplier 134 includes n T-type flip-flops and multiplies the period Tc of the input clock signal by $2^n$, where n is an integer greater than or equal to 1.

In this way, the timer circuit 130 sets the timer time T to be the pulse width, and therefore sets the timer time T to be $Tc \cdot 2^{n-1}$, which is ½ of the period. When the control signal input from the control terminal 102 continues in the high potential state for a time longer than the timer time T, the timer circuit 130 outputs the clock signal of the next period. In other words, the timer circuit 130 becomes the high potential after the time T has passed from when the control signal became the high potential, on a condition that the control signal remains at the high potential. The timer circuit 130 supplies the timer signal to the latch section 160.

The trigger section 140 outputs a trigger signal, in response to the control signal for controlling the power semiconductor element 110 becoming higher than a reference voltage. For example, the trigger section 140 outputs the trigger signal with the low potential to the reset section 150, in response to the control signal changing from the low potential to the high potential. The trigger section 140 operates using the control signal input from the control terminal 102 as a power source, and does not output a signal when this control signal is the low potential, for example.

The reset section 150 outputs the reset signal during a predetermined interval, in response to the control signal becoming the high potential. The reset section 150 outputs the reset signal with the high potential, in response to receiving the trigger signal from the trigger section 140. The reset section 150 outputs a pulse signal having a predetermined pulse width as the reset signal, for example, to the latch section 160. The reset section 150 operates using the control signal input from the control terminal 102 as a power source, and does not output a signal when this control signal is the low potential, for example.

The latch section 160 is reset in response to the reset signal, and latches the acquisition of the timer signal from the timer circuit. The latch section 160 generates a cutoff signal and supplies the gate terminal of the cutoff section 120 with the cutoff signal, in response to current continuing to flow through the power semiconductor element for more than a predetermined time. The latch section 160 cuts off the supply of the control signal from the control terminal 102 to the power semiconductor element 110 by outputting the cutoff signal. The latch section 160 generates the cutoff signal that changes from the low potential to the high potential, for example. In this way, the power semiconductor element 110 is switched to the OFF state. The latch section 160 operates using the control signal input from the control terminal 102 as a power source, and does not output a signal when this control signal is the low potential, for example. The latch section 160 is an RS flip-flop, for example.

In the switch apparatus 100 according to the present embodiment described above, the power semiconductor element 110 is in the ON state when the power semiconductor element 110 is in a normal state and the control signal is the high potential. Therefore, the collector current Ic flows through the primary coil 32 of the ignition coil 30 from the power source 40. The change over time dIc/dt of the collector current Ic is determined according to the inductance of the primary coil 32 and the supply voltage of the power source 40, and increases up to a predetermined (or set) current value. For example, the collector current Ic increases to a value of approximately several amperes, ten to twenty amperes, or tens of amperes.

When the switching control signal becomes the low potential, the power semiconductor element 110 enters the OFF state and the collector current decreases sharply. As a result of the sharp decrease of the collector current, the voltage across the primary coil 32 increases sharply due to the self-induced electromotive force, thereby causing an induced electromotive force reaching approximately tens of kilovolts as the voltage across the secondary coil 34. The ignition apparatus 1000 causes the discharge of the ignition plug 20 and ignites the combustion gas by supplying such a voltage of the secondary coil 34 to the ignition plug 20.

When the control signal continues to be in the high potential state due to damage in the control signal generating section 10 or the like, the timer circuit 130 detects the continuation of the high potential and supplies the timer signal to the latch section 160, and the latch section 160 cuts off the supply of the control signal from the control terminal 102 to the power semiconductor element 110. As a result, the gate potential of the power semiconductor element 110 becomes the OFF potential, and the collector current Ic is cut off.

When the state of the collector current Ic flowing through the power semiconductor element 110 continues, the power semiconductor element 110 and the ignition coil 30 become heated and there are cases where damage or the like occurs. In the ignition apparatus 1000 according to the present embodiment, even when the high potential state of the control signal that is a cause of such damage or the like continues, the cutoff section 120 cuts off the collector current Ic by cutting off the supply of the control signal to the power semiconductor element 110, and therefore the it is possible to prevent breakdown, operational defects, and the like from occurring in the ignition apparatus 1000 and components of the automobile.

The above describes an example of the switch apparatus 100 in which the timer circuit 130 detects the continuation of the high potential of the control signal. The timer circuit 130 uses the control signal as an operating power source and does not receive a power source supply from the outside, and therefore it is possible to reduce the circuit size without providing a terminal for inputting a power source, a circuit for detecting excessive voltage in the input power source, a transmission circuit, a protective circuit, and the like. The clock circuit 132 including such a timer circuit 130 is described using FIG. 2.

Figure 2:
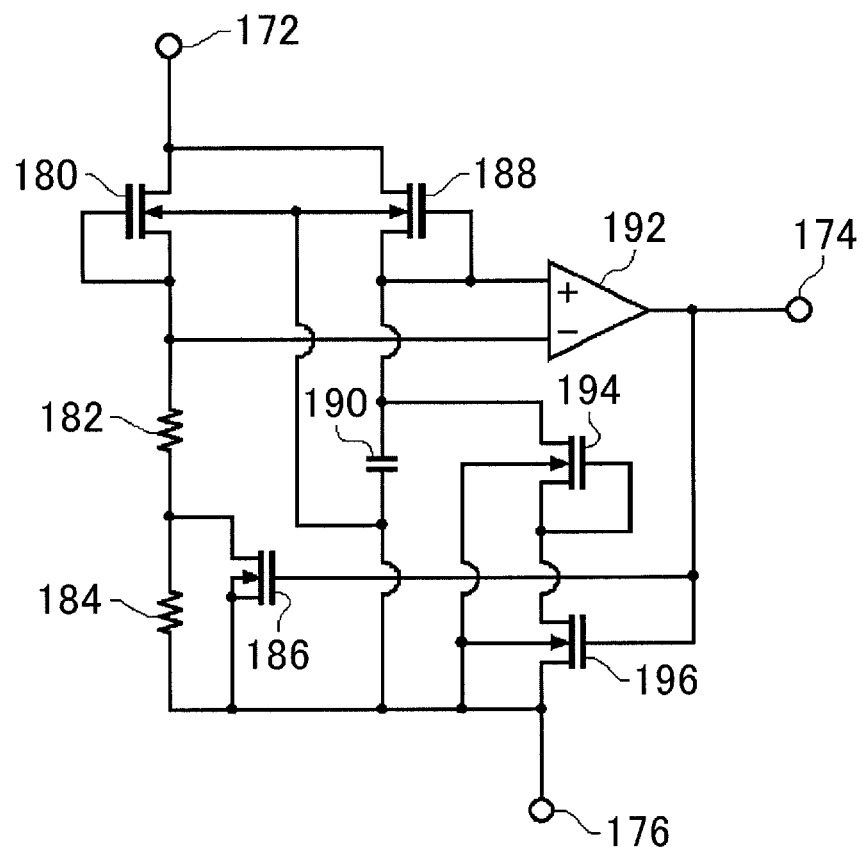
FIG. 2 shows an exemplary configuration of the clock circuit 132 according to the present embodiment.

FIG. 2 shows an exemplary configuration of the clock circuit 132 provided in the switch apparatus 100. The clock circuit 132 includes a control signal input section 172, a clock signal output section 174, a reference potential input section 176, a transistor 180, a resistor 182, a resistor 184, a transistor 186, a transistor 188, a capacitor 190, a comparator 192, a transistor 194, and a transistor 196.

The transistor 180, the transistor 188, and the transistor 194 are each a depression MOSFET in which the gate and source are connected to be used in the ON state, for example. The transistor 186 and the transistor 196 each create an electrical connection or electrical disconnection between the source and the drain thereof, according to the potential supplied to the gate thereof. The transistor 180, the transistor 186, the transistor 188, the transistor 194, and the transistor 196 are preferably each formed by an nMOS.

The drain terminal of the transistor 180 is connected to the control signal input section 172, and the gate terminal and the source terminal of the transistor 180 are connected to one of the terminals of the resistor 182. The other terminal of the resistor 182 is connected to one of the terminals of the resistor 184, and the other terminal of the resistor 184 is connected to the reference potential input section 176. In other words, the transistor 180, the resistor 182, and the resistor 184 are connected in series between the control signal input section 172 and the reference potential input section 176.

The drain terminal of the transistor 186 is connected between the resistor 182 and the resistor 184, and the source terminal of the transistor 186 is connected to the reference potential input section 176. The drain terminal of the transistor 188 is connected to the control signal input section 172, and the gate terminal and the source terminal of the transistor 188 are connected to one of the terminals of the capacitor 190. The other terminal of the capacitor 190 is connected to the reference potential input section 176.

The positive-side input terminal of the comparator 192 is connected to the source terminal of the transistor 188, the negative-side input terminal of the comparator 192 is connected to the source terminal of the transistor 180, and the output terminal of the comparator 192 is connected to the clock signal output section 174. It should be noted that the output terminal of the comparator 192 is connected to the respective gate terminals of the transistor 186 and the transistor 196.

The drain terminal of the transistor 194 is connected to one of the terminals of the capacitor 190, and the source terminal of the transistor 194 is connected to the drain terminal of the transistor 196. The source terminal of the transistor 196 is connected to the reference potential input section 176. In other words, the capacitor 190, the transistor 194, and the transistor 196 are connected in parallel between the source terminal of the transistor 188 and the reference potential input section 176. The following describes the operation of such a clock circuit 132.

Figure 3:
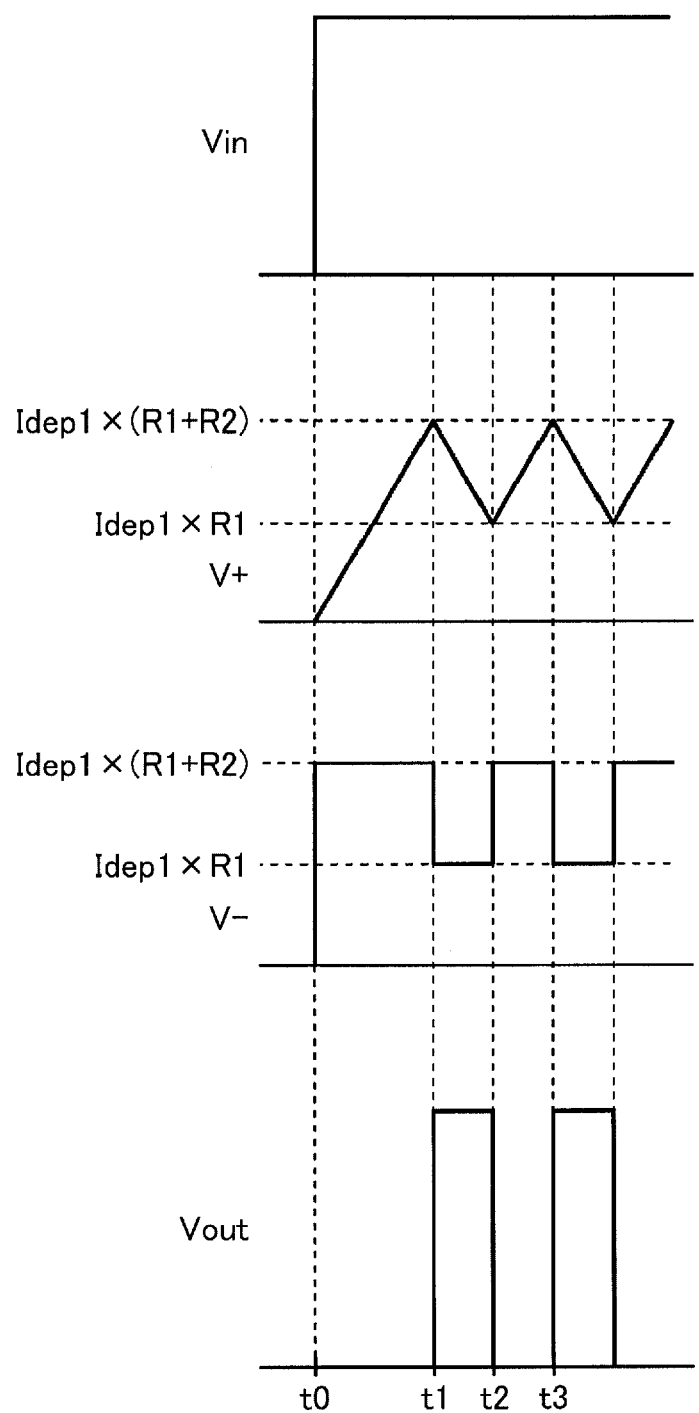
FIG. 3 shows an exemplary operational waveform of each component of the clock circuit 132 shown in FIG. 2.

FIG. 3 shows an exemplary operational waveform of each component of the clock circuit 132 shown in FIG. 2. In FIG. 3, the horizontal axis indicates time and the vertical axis indicates the output potential. Furthermore, Vin indicates the control signal, V+ indicates the potential of the positive-side input terminal of the comparator 192, V- indicates the potential of the negative-side input terminal of the comparator 192, and Vout indicates the output signal of the clock signal output section 174. In addition, R1 indicates the resistance value of the resistor 182, R2 indicates the resistance value of the resistor 184, Idep1 indicates the source current of the transistor 180, Idep1 indicates the source current of the transistor 188, and Idep2 indicates the drain current of the transistor 194. The transistor 180 and the transistor 188 have substantially the same shape and substantially the same source current.

When the initial state of the control signal is the low potential, the output of the comparator 192 is also the low potential, and so the transistor 186 and the transistor 196 are both in the OFF state. At the timing t0, when the control signal becomes the high potential, the transistor 186 is in the OFF state, and therefore the source current Idep1 of the transistor 180 flows through the resistor 182 and the resistor 184 and the potential V- of the negative-side input terminal of the comparator 192 becomes Idep1·(R1+R2).

Furthermore, since the transistor 196 is in the OFF state, the capacitor 190 is charged by the source current Idep1 of the transistor 188. In accordance with the charging of the capacitor 190, the potential V+ of the positive-side input terminal of the comparator 192 increases over time from 0 V. The potential V- of the negative-side input terminal of the comparator 192 is higher than the potential V+ of the positive-side input terminal of the comparator 192 until the potential V+ increases to Idep1·(R1+R2), and therefore the output of the comparator 192 (i.e. the output signal Vout of the clock signal output section 174) remains at the low potential.

At the timing t1, when the charged potential of the capacitor 190 (i.e. the potential V+ of the positive-side input terminal of the comparator 192) exceeds Idep1·(R1+R2), the output signal Vout of the clock signal output section 174 becomes the high potential and the transistor 186 and the transistor 196 are switched to the ON state. When this happens, the source current Idep1 of the transistor 180 flows through the resistor 182 and the transistor 186, and the potential V- of the negative-side input terminal of the comparator 192 becomes Idep1·R1.

Furthermore, since the transistor 196 is in the ON state, the charge accumulated in the capacitor 190 is discharged to flow to the reference potential through the transistor 194 and the transistor 196. In other words, in accordance with the discharge of the capacitor 190, the potential V+ of the positive-side input terminal of the comparator 192 decreases over time from Idep1·(R1+R2). Since the potential V- of the negative-side input terminal of the comparator 192 is lower than the potential V+ of the positive-side input terminal of the comparator 192 until the potential V+ decreases to Idep1·R1, the output signal Vout of the clock signal output section 174 remains at the high potential.

At the timing t2, when the potential V+ of the positive-side input terminal of the comparator 192 drops below Idep1·R1, the output signal Vout of the clock signal output section 174 becomes the low potential, and the transistor 186 and the transistor 196 are switched to the OFF state. When this happens, the source current Idep1 of the transistor 180 flows through the resistor 182 and the resistor 184, and the potential V- of the negative-side input terminal of the comparator 192 becomes Idep1·(R1+R2).

Furthermore, since the transistor 196 is in the OFF state, the capacitor 190 is charged and the potential V+ of the positive-side input terminal of the comparator 192 increases over time from Idep1·R1. Since the potential V- of the negative-side input terminal of the comparator 192 is higher than the potential V+ of the positive-side input terminal of the comparator 192 until the potential V+ reaches Idep1·(R1+R2), the output signal Vout of the clock signal output section 174 remains at the low potential until the timing t3. In the manner described above, the clock circuit 132 can output the output signal Vout as the clock signal by repeating the charging and discharging of the capacitor 190. The following describes the operation of switching the power semiconductor element 110 according to such a clock signal.

Figure 4:
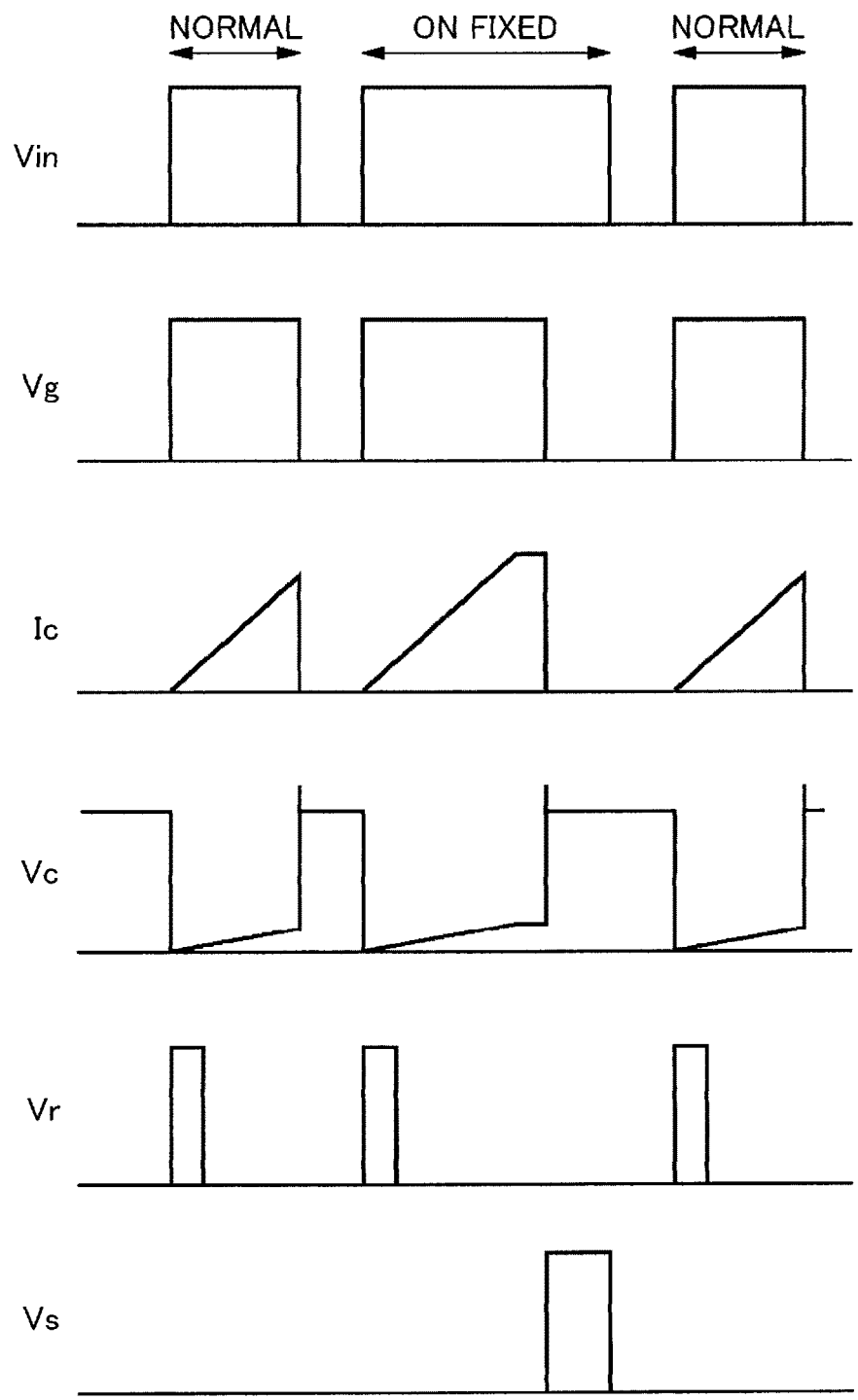
FIG. 4 shows an exemplary operational waveform of each component of the switch apparatus 100 according to the present embodiment.

FIG. 4 shows an operational waveform of each component of the switch apparatus 100 according to the present embodiment. In FIG. 4, the horizontal axis indicates time and the vertical axis indicates the voltage value or the current value. Furthermore, in FIG. 4, each time waveform is labeled such that Vin indicates the control signal input from the control terminal 102, Vg indicates the potential of the gate terminal of the power semiconductor element 110, Ic indicates the collector-emitter current (referred to as the collector current) of the power semiconductor element 110, Vc indicates the collector-emitter voltage (referred to as the collector voltage) of the power semiconductor element 110, Vr indicates the reset signal output by the reset section 150, and Vs indicates the timer signal output by the timer circuit 130.

When the control signal Vin input to the switch apparatus 100 is the low potential (e.g. 0 V), the reset signal Vr, the timer signal Vs, and the gate potential Vg are the low potential (0 V), the power semiconductor element 110 is in the OFF state, the collector current Ic is 0 A, and the collector voltage Vc is the output voltage of the power source 40 (e.g. 14 V).

When the control signal Vin becomes the high potential (e.g. 5 V), the gate potential Vg becomes the high potential, thereby switching the power semiconductor element 110 to the ON state, the collector current Ic begins increasing, and the collector voltage Vc begins increasing after becoming substantially 0 V. Furthermore, the trigger section 140 outputs the trigger signal with the low potential, and the reset section 150 outputs the reset signal Vr with the high potential.

After the control signal Vin has become the high potential, when the control signal Vin again becomes the low potential during an interval shorter than the timer time T counted by the timer circuit 130, this low potential becomes the gate potential Vg of the power semiconductor element 110, and therefore the power semiconductor element 110 is switched to the OFF state. In this way, the ignition operation described in FIG. 1 is performed, the collector current Ic returns to substantially 0 A, and the collector voltage Vc returns to the output potential of the power source. As part of the ignition operation, the collector voltage Vc returns to the output potential of the power source after temporarily reaching a high voltage. The above describes the operation of the switch apparatus 100 in the range shown in FIG. 4 where the control signal Vin is "normal".

The following describes an example in which the high potential state of the control signal Vin continues beyond the timer time T. In this case, until reaching the state where the control signal Vin has become the high potential, the power semiconductor element 110 is switched to the ON state, the collector current Ic begins increasing, and the collector voltage Vc begins increasing after becoming substantially 0 V, as already described above. Furthermore, the trigger section 140 outputs the trigger signal and the reset section 150 outputs the reset signal Vr.

When the high potential state of the control signal Vin continues, the collector current Ic continues to increase and the temperature of the power semiconductor element 110 rises. Then, the collector voltage Vc and the collector current Ic become saturated, and when this state continues, there are cases where damage or the like occurs in the switch apparatus 100 and components such as the ignition coil 30 connected to the switch apparatus 100. In order to prevent such damage or the like, when the timer time T has passed from when the control signal Vin became the high potential, the timer circuit 130 outputs the timer signal Vs indicating that an abnormality has been detected. The latch section 160 latches the timer signal Vs and outputs the cutoff signal, thereby setting the gate potential Vg to the low potential. Therefore, the power semiconductor element 110 is switched to the OFF state. In this way, the ignition operation described in FIG. 1 is performed, the collector current Ic returns to substantially 0 A, and the collector voltage Vc returns to the output voltage of the power source.

After the collector current Ic and the collector voltage Vc have returned to the original values, when the control signal Vin becomes the low potential, the power source supply to the latch section 160 is cut off, and therefore the cutoff signal becomes the low potential. The above describes the operation of the switch apparatus 100 in the range shown in FIG. 4 where the control signal Vin is "ON fixed". As described above, the switch apparatus 100 according to the present embodiment can detect that the state of current flowing through the power semiconductor element 110 has undesirably continued for a time greater than or equal to the timer time T, and switch the power semiconductor element 110 to the OFF state.

However, when manufacturing the switch apparatus 100 shown in FIG. 1 as an integrated circuit, even when formed on one chip, there are cases where the chip size cannot be reduced. As described in the following, this is because the clock circuit 132 uses a clock period that is short compared to the timer time T and the area of the frequency multiplier 134 is increased. The period of the clock signal generated by the clock circuit 132 of the timer circuit 130 depends on the charging time of the capacitor 190, and therefore depends on the capacitance of the capacitor 190. However, when the capacitance C of the capacitor 190 is increased, the size of the capacitor 190 also increases, and therefore when miniaturizing the switch apparatus 100, the capacitance C of the capacitor 190 becomes approximately 100 pF.

Furthermore, in order to output a stable clock signal, the potential V− of the negative-side input terminal preferably has a constant amplitude $\Delta V-\{=Idep1\cdot(R1+R2)-Idep1\cdot R1=Idep1\cdot R2\}$. Accordingly, the transistor 180 is preferably in a pinch-off state in which the drain current is saturated. Here, with a potential of approximately 2.5 V to 5 V used as the high potential of the control signal and 2 V used as the pinch-off voltage of the transistor 180, $\Delta V-$ becomes less than 0.5 V. Since $\Delta V-$ is also the amplitude $\Delta V+$ of the potential V+ of the positive-side input terminal, the charge Q accumulated in the capacitor 190 is less than $C\cdot\Delta V+$.

Accordingly, the charge Q accumulated in the capacitor 190 is proportional to the capacitance of the capacitor 190 and the high potential of the control signal. Since there is a limit to the size of the capacitance C of the capacitor 190, as described above, or since the control signal is a signal output to the switch apparatus 100 from the outside, when designing the switch apparatus 100, the high potential of the control signal cannot be set to a high value. In other words, even if the design parameters of the switch apparatus 100 are changed, there is a limit on the period Tc of the clock signal generated by the clock circuit 132, and when Idep 1 is approximately 1 µA, for example, the period Tc becomes approximately 10 µs.

When the timer circuit 130 sets the timer time T to 10 ms, for example, the frequency multiplier 134 multiplies the clock period output by the clock circuit 132 by approximately 2000. Accordingly, the frequency multiplier 134 is provided with approximately eleven T-type flip-flops, for example, and as a result the circuit size of the timer circuit 130 increases. The switch apparatus 200 according to the present embodiment outputs a timer signal with a stable timer time, while also reducing the circuit size. The following describes such a switch apparatus 200.

Figure 5:
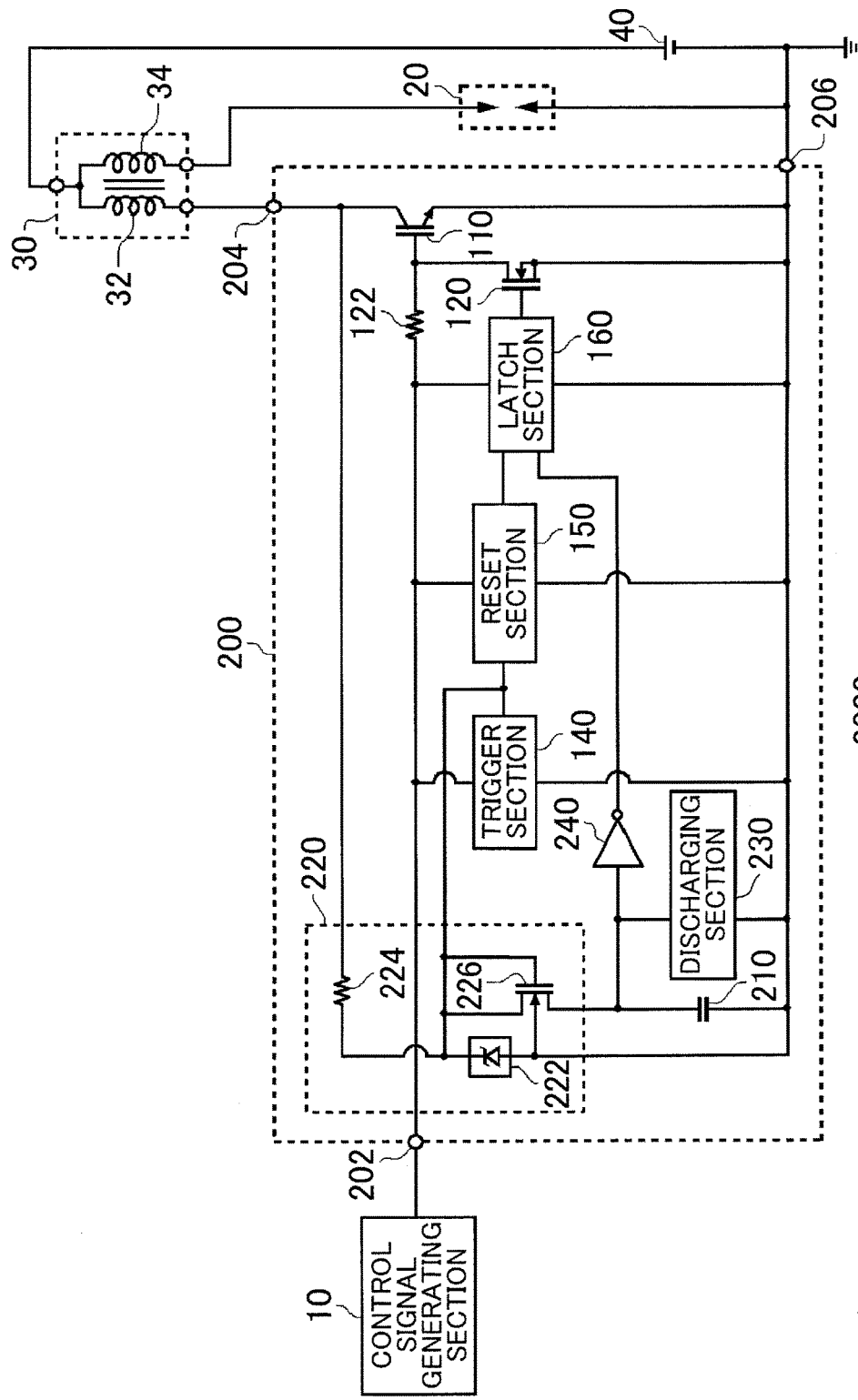
FIG. 5 shows an exemplary configuration of the ignition apparatus 2000 according to the present embodiment.

FIG. 5 shows an exemplary configuration of a switch apparatus 200 according to the present embodiment. In the ignition apparatus 2000 shown in FIG. 5, components that have substantially the same operation as components of the ignition apparatus 1000 according to the embodiment shown in FIG. 1 are given the same reference numerals and descriptions thereof are omitted. The ignition apparatus 2000 includes the switch apparatus 200. Descriptions of the control signal generating section 10, the ignition plug, the ignition coil 30, and the power source 40 included in the ignition apparatus 2000 are omitted.

The switch apparatus 200 includes a control terminal 202, a first terminal 204, a second terminal 206, the power semiconductor element 110, the cutoff section 120, the resistor 122, the trigger section 140, the reset section 150, the latch section 160, a capacitor 210, a charging section 220, a discharging section 230, and an inverter 240. The control terminal 202 inputs the control signal for controlling the power semiconductor element 110. The control terminal 202 is connected to the control signal generating section 10 and receives the control signal. The first terminal 204 is connected to the power source 40 via the ignition coil 30. The second terminal 206 is connected to the reference potential. In other words, the first terminal 204 is a terminal on a high potential side compared to the second terminal 206 and the second terminal 206 is a terminal on a low potential side compared to the first terminal 204.

The power semiconductor element 110, the cutoff section 120, and the resistor 122 were described in FIG. 1, and are therefore not described here. One terminal of the capacitor 210 is connected to the reference potential via the second terminal 206, and the other terminal of the capacitor 210 is connected to the charging section 220.

The trigger section 140 outputs the trigger signal in response to the control signal for controlling the power semiconductor element 110 becoming higher than a reference voltage. The trigger section 140 supplies the reset section 150 and the charging section 220 with the trigger signal having the low potential, in response to the control signal changing from the low potential to the high potential. The trigger section 140 operates using the control signal input from the control terminal 202 as a power source, and does not output a signal when this control signal is the low potential, for example.

The reset section 150 outputs the reset signal during a predetermined interval, in response to the control signal becoming the high potential. The reset section 150 outputs the reset signal with the high potential, in response to the trigger signal received from the trigger section 140. The reset section 150 outputs a pulse signal having a predetermined pulse width, for example, as the reset signal to the latch section 160. The reset section 150 operates using the control signal input from the control terminal 202 as a power source, and does not output a signal when this control signal is the low potential, for example.

The latch section 160 is reset in response to the reset signal, and latches the reception of the timer signal from the inverter 240. The latch section 160 generates the cutoff signal and supplies the gate terminal of the cutoff section 120 with the cutoff signal, in response to current continuing to flow through the power semiconductor element for more than a predetermined time. The latch section 160 cuts off the supply of the control signal from the control terminal 202 to the power semiconductor element 110 by outputting the cutoff signal. The latch section 160 generates the cutoff signal that changes from the low potential to the high potential, for example. In this way, the power semiconductor element 110 is switched to the OFF state. The latch section 160 operates using the control signal input from the control terminal 202 as a power source, and does not output a signal when this control signal is the low potential, for example. The latch section 160 is an RS flip-flop, for example.

The charging section 220 charges the capacitor 210 for at least a portion of the interval during which the power semiconductor element 110 is OFF. The charging section 220 is connected to the first terminal 204 and charges the capacitor 210 with the voltage from the first terminal 204. The charging section 220 includes a clamping section 222, a first resistor 224, and a switch section 226.

The clamping section 222 is connected in parallel with the capacitor 210 between the first terminal 204 and the reference potential. When the voltage from the first terminal 204 is higher than a predetermined voltage, the clamping section 222 clamps the voltage from the first terminal 204 at this predetermined voltage. The predetermined voltage is referred to as the clamp voltage. The clamping section 222 includes a Zener diode connected in parallel with the capacitor 210 between the first terminal 204 and the reference potential, for example. The anode of the Zener diode is connected to the second terminal 206.

The first resistor 224 is connected between the first terminal 204 and a terminal on the first terminal 204 side of the capacitor 210 and clamping section 222. One end of the first resistor 224 is connected to the first terminal 204, and the other end of the first resistor 224 is connected to the cathode of the Zener diode. In other words, the first resistor 224 and the clamping section 222 are connected in series between the first terminal 204 and the second terminal 206. When the clamping section 222 clamps the voltage from the first terminal 204 and causes current to flow, the first resistor 224 prevents a temperature increase caused by the current by limiting the amount of current flowing through the clamping section 222.

The switch section 226 switches between an electrical connection and an electrical disconnection between the other end of the first resistor 224 and the other terminal of the capacitor 210. The switch section 226 includes a transistor, for example. In this case, the gate terminal and the collector terminal of the switch section 226 are connected to the other end of the resistor 224, and the emitter terminal of the switch section 226 is connected to the other terminal of the capacitor 210. In other words, the switch section 226 and the capacitor 210 are connected in series between the other end of the first resistor 224 and the second terminal 206. Furthermore, the switch section 226 and the capacitor 210 are connected in parallel with the clamping section 222 between the other end of the first resistor 224 and the second terminal 206.

When the clamping section 222 clamps the voltage from the first terminal 204, the switch section 226 enters the ON state due to the clamp voltage and supplies the capacitor 210 with the clamp voltage. As a result, the capacitor 210 is charged with the voltage clamped by the clamping section 222. Furthermore, the switch section 226 receives the trigger signal from the trigger section 140 at the gate terminal and the emitter terminal thereof. The gate terminal and the emitter terminal of the switch section 226 become the low potential due to the trigger signal, and therefore the switch section 226 enters the OFF state and stops supplying the clamp voltage to the capacitor 210. In other words, the switch section 226 cuts off the connection between the first terminal 204 and the capacitor 210, in response to the trigger signal.

The discharging section 230 gradually discharges the charge accumulated in the capacitor 210, in response to the power semiconductor element 110 becoming ON. The discharging section 230 is connected between the other terminal of the capacitor 210 and the second terminal 206, and causes the charge accumulated in the other terminal of the capacitor 210 to be discharged to the reference potential, for example. The discharging section 230 includes a second resistor and/or a constant current source connected in parallel with the capacitor 210 between the first terminal 204 and the reference potential, for example.

The inverter 240 is connected between the other terminal of the capacitor 210 and the latch section 160, and supplies the latch section 160 with an inverted logical output corresponding to the potential of the capacitor 210. The inverter 240 uses the control signal input from the control terminal 202 as an operational power source and supplies the latch section 160 with the inverted logical output on a condition that the control signal is the high potential, for example.

When the charge accumulated in the capacitor 210 exceeds a threshold value and becomes the high potential, the inverter 240 supplies the latch section 160 with the low potential. Furthermore, when the charge of the capacitor 210 is discharged by the discharging section 230 and becomes the low potential that is less than or equal to the threshold value, the inverter 240 supplies the latch section 160 with the high potential. In other words, the inverter 240 outputs the timer signal with the high potential using the time needed for the input potential to become less than or equal to a threshold value due to the discharge by the discharging section 230 as the timer time T.

As described above, the switch apparatus 200 according to the present embodiment charges the capacitor 210 with the charging section 220 using the voltage on the first terminal 204 side, instead of the timer circuit 130 of the switch apparatus 100 described in FIG. 1. Therefore, when the power semiconductor element 110 is in the OFF state, the charging section 220 can perform charging using the voltage clamped from the potential of the power source 40 (e.g. 14 V), and so it is possible to charge the capacitor 210 with a voltage greater than or equal to 5 V. Accordingly, the switch apparatus 200 is capable of increasing the amount of charge accumulated in the capacitor 210 by substantially 10 times or more of the amount of charge accumulated in the capacitor 190 by the timer circuit 130, even when the capacitances of the capacitor 210 and the capacitor 190 are substantially the same.

Furthermore, the switch apparatus 200 can use the discharging section 230 to discharge the charge accumulated in the capacitor 210, and can perform the discharge according to a time constant determined by the capacitor 210 and the discharging section 230. In other words, even when the capacitance of the capacitor 210 is approximately 100 pF, for example, the switch apparatus 200 can make the time constant of the discharge longer than that of the timer circuit 130 by adjusting the amount of current that the discharging section 230 causes to flow to the reference potential. Accordingly, the switch apparatus 200 can set the timer time T of the timer signal output by the inverter 240 to be a time in units of milliseconds, without using the frequency multiplier 134 described in FIG. 1.

Figure 6:
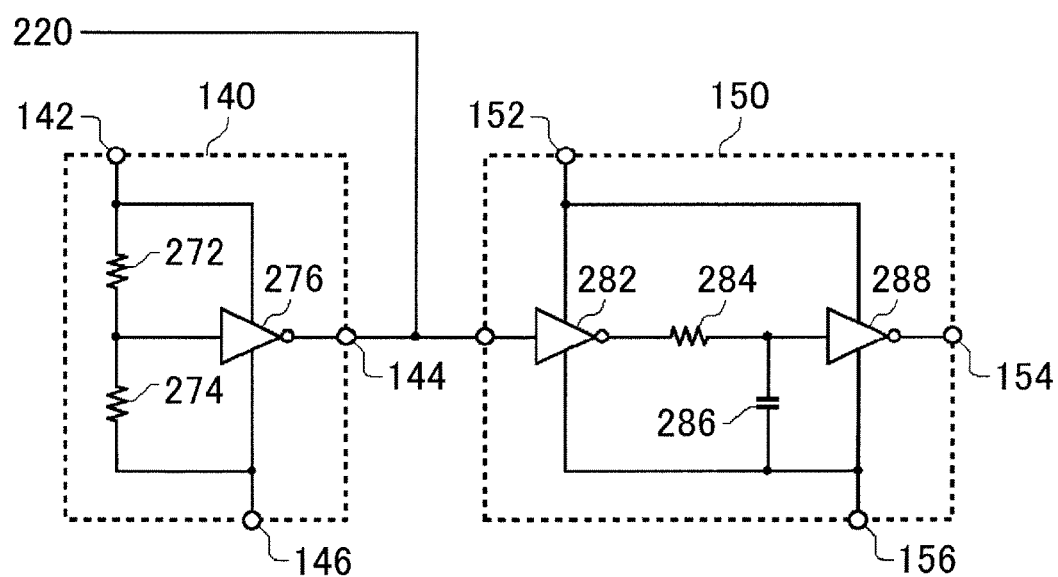
FIG. 6 shows an exemplary configuration of the trigger section 140 and the reset section 150 according to the present embodiment.

FIG. 6 shows an exemplary configuration of the trigger section 140 and the reset section 150 according to the present embodiment. The trigger section 140 includes a control signal input section 142, a trigger signal output section 144, a reference potential input section 146, a resistor 272, a resistor 274, and an inverter 276. The reset section 150 includes a control signal input section 152, a reset signal output section 154, a reference potential input section 156, an inverter 282, a resistor 284, a capacitor 286, and an inverter 288.

The control signal input section 142 and the control signal input section 152 have the control signal input from the control terminal 202 input thereto. The trigger signal output section 144 outputs the trigger signal generated by the trigger section 140. The reset signal output section 154 outputs the reset signal generated by the reset section 150. The reference potential input section 146 and the reference potential input section 156 are connected to the reference potential via the second terminal 206.

The resistor 272 and the resistor 274 are connected in series between the control signal input section 142 and the reference potential input section 146, and voltage-divide the control signal Vin input from the control signal input section 142. With R1 indicating the resistance value of the resistor 272 and R2 indicating the resistance value of the resistor 274, the voltage-divided potential becomes Vin·R2/(R1+R2). For example, when the control signal transiently rises linearly from the low potential (e.g. 0 V) to the high potential (e.g. 5 V), the voltage-divided potential also rises linearly from 0 V to 5·R2/(R1+R2).

The inverter 276 is connected between the resistor 272 and the resistor 274, receives the voltage-divided potential, and outputs the inverse of the voltage-divided potential. The trigger section 140 outputs the output of the inverter 276 as the trigger signal. When the control signal Vin is the low potential, the inverter 276 has an operating power source of 0 V, and therefore cannot output a signal. However, when the clamp voltage from the charging section 220 is supplied to the trigger signal output section 144, the potential of the trigger signal output section 144 becomes substantially equal to this clamp potential.

The inverter 282 receives the output of the inverter 276 and outputs the inverse of this output. The resistor 284 and the capacitor 286 form an RC circuit that receives the output of the inverter 282 and outputs a rising signal having a delay of a time constant RC. The inverter 288 receives the output of the resistor 284 and the capacitor 286 and output the inverse of this output.

The inverter 276, the inverter 282, and the inverter 288 each use the control signal as an operating power source. Accordingly, during the process of the control signal transiently rising, the inverter 276, the inverter 282, and the inverter 288 each output a signal having substantially the same potential as the control signal until the control signal reaches the threshold value of the inverter. In this example, the threshold value of each inverter is set to be substantially the same value V1. The following describes the operation of each component in such a trigger section 140 and reset section 150.

Figure 7:
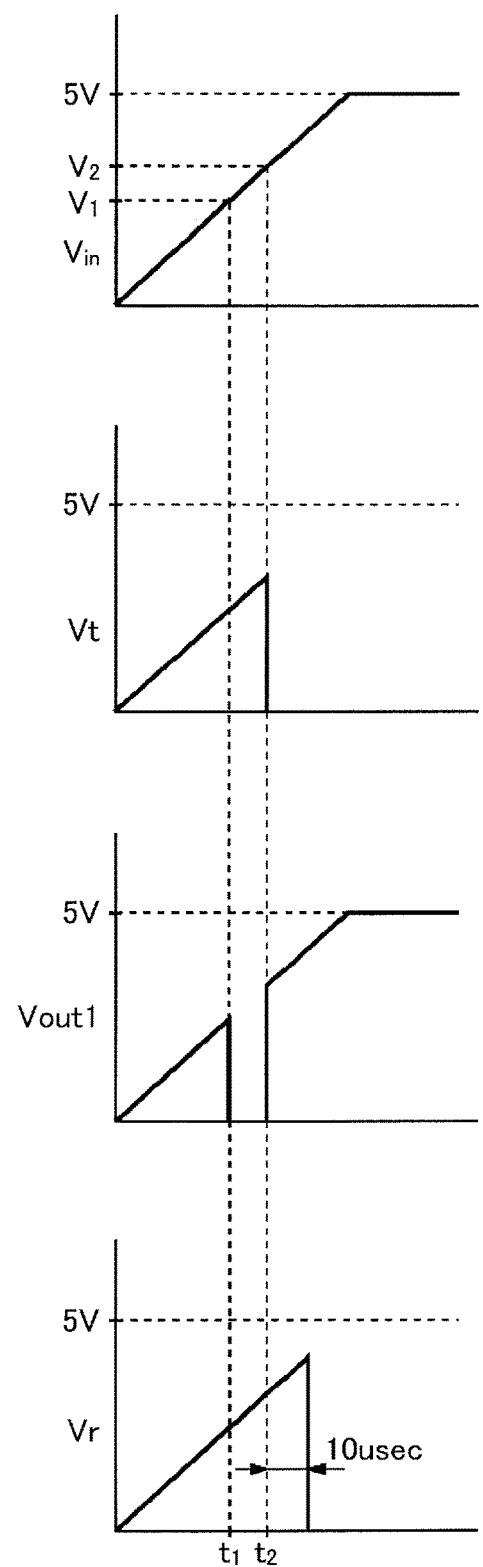
FIG. 7 shows exemplary operational waveforms of the trigger section 140 and the reset section 150 according to the present embodiment.

FIG. 7 shows exemplary operational waveforms of the trigger section 140 and the reset section 150 according to the present embodiment. In FIG. 7, the horizontal axis indicates time and the vertical axis indicates the output potential. FIG. 7 shows an example of the output potentials of the inverter 276, the inverter 282, and the inverter 288 in a case where the control signal rises linearly from the OFF potential (0 V) to the ON potential (5 V).

In FIG. 7, Vin indicates the control signal, Vt indicates the output of the inverter 276, i.e. the output of the trigger section 140, Vout1 indicates the output of the inverter 282, and Vr indicates the output of the inverter 288, i.e. the output of the reset section 150. The respective output potentials Vt, Vout1, and Vr of the inverter 276, the inverter 282, and the inverter 288 are substantially the same as the power source potential (i.e. the potential of the control signal Vin) until the input potential reaches the threshold value of the inverters.

At the timing t1, the input voltage-divided potential Vin·R2/(R1+R2) has a value less than or equal to the threshold value V1 even when the power source potential (i.e. Vin) exceeds the threshold value V1, and therefore the inverter 276 receives the input potential as the low potential and outputs the inverse thereof, which is the high potential. When the power source potential is a transient potential during the process of reaching the high potential (e.g. 5V), if the inverter 276 is operating in a manner to output the high potential, the inverter 276 outputs this transient power source potential as the high potential. FIG. 7 shows an example in which the output potential Vt of the inverter 276 becomes substantially equal to the power source potential Vin at the timing t1 and onward.

At the timing t2, in response to the power source potential Vin exceeding the threshold value V1 and the input voltage-divided potential exceeding the threshold value V1 (i.e. input of the high potential), the inverter 276 outputs the low potential as the inverted output. FIG. 7 shows an example in which the output potential Vt of the inverter 276 becomes the low potential (0 V) at the timing t2. In other words, in response to the control signal Vin becoming the high potential, the trigger section 140 outputs the low potential that is less than the threshold value V1.

At the timing t1, in response to the power source potential Vin exceeding the threshold value V1 and the input potential being a potential that exceeds the threshold value V1, the inverter 282 outputs the low potential as the inverted output. FIG. 7 shows an example in which the output potential Vout1 of the inverter 282 becomes the low potential at the timing t1. At the timing t2, in response to the power source potential Vin exceeding the threshold value V1 and the input potential being the low potential, the inverter 282 outputs the high potential as the inverted output. When the power source potential Vin is a transient potential during the process of reaching the high potential, the inverter 282 outputs this transient power source potential as the high potential. FIG. 7 shows an example in which the output potential Vout1 of the inverter 282 becomes substantially the same as the power source potential Vin at the timing t2 and onward.

The RC circuit formed by the resistor 284 and the capacitor 286 delays the output signal of the inverter 282. FIG. 7 shows an example in which the RC circuit delays the output signal by 10 μs. In response to the power source potential Vin exceeding the threshold value V1 and the input potential being a potential that exceeds the threshold value V1, the inverter 288 outputs the low potential as the inverted output. FIG. 7 shows an example in which the output potential Vr of the inverter 288 becomes the low potential at a timing that is 10 μs later than the timing t2.

In the manner described above, after the reference time t2 has passed from when the control signal became the high potential, the reset section 150 according to the present embodiment outputs the reset signal having a predetermined pulse width. The reset signal shown in FIG. 7 is a pulse signal having a pulse width with a time constant of 10 μs set by the resistor 284 and the capacitor 286, for example.

The latch section 160 is reset by the reset signal output in response to the trigger signal in this manner, and is set according to the timer signal indicating that the voltage of the capacitor 210 has become lower than the threshold voltage. In other words, the latch section 160 latches the timer signal that is output in response to the interval during which the power semiconductor element 110 is in the ON state exceeding the timer time T, on a condition that the control signal is the high potential. The latch section 160 then supplies the cutoff section 120 with the cutoff signal. The cutoff section 120 sets the gate potential of the power semiconductor element 110 to the OFF potential, thereby setting the power semiconductor element 110 to the OFF state, in response to the latch section being set.

In the manner described above, the switch apparatus 200 according to the present embodiment operates as an ignitor that controls the current flowing through the ignition coil 30 connected to the first terminal 204, according to the control signal for controlling the power semiconductor element, while limiting the operation according to the time that the power semiconductor element 110 has continued in the ON state. The following describes the operation of such a switch apparatus 200.

Figure 8:
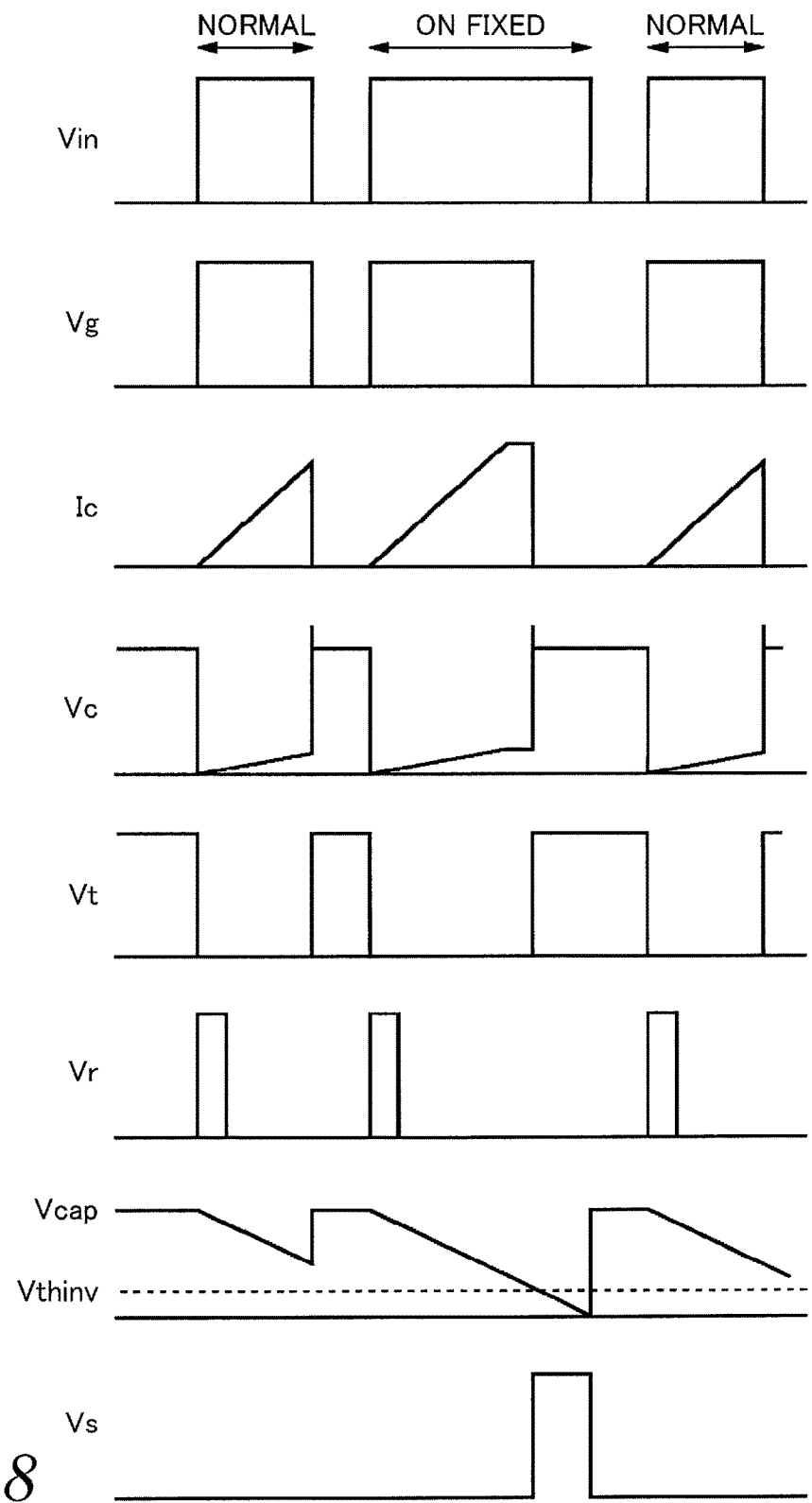
FIG. 8 shows an exemplary operational waveform of each component of the switch apparatus 200 according to the present embodiment.

FIG. 8 shows an example of an operational waveform of each component of the switch apparatus 200 according to the present embodiment. In FIG. 8, the horizontal axis indicates time and the vertical axis indicates the voltage value or the current value. In FIG. 8, each time waveform is labeled such that Vin indicates the control signal input from the control terminal 202, Vg indicates the potential of the gate terminal of the power semiconductor element 110, Ic indicates the collector-emitter current (referred to as the collector current) of the power semiconductor element 110, Vc indicates the collector-emitter voltage (referred to as the collector voltage) of the power semiconductor element 110, Vt indicates the trigger signal output by the trigger section 140, Vr indicates the reset signal output by the reset section 150, Vcap indicates the potential of the capacitor 210, and Vs indicates the timer signal output by the inverter 240.

When the control signal Vin input to the switch apparatus 100 is the low potential (e.g. 0 V), the reset signal Vr, the timer signal Vs, and the gate potential Vg are the low potential (0 V), the power semiconductor element 110 is in the OFF state, the collector current Ic is 0 A, and the collector voltage Vc is the output voltage of the power source 40 (e.g. 14 V). Furthermore, since the collector voltage Vc is the output voltage of the power source 40, the clamping section 222 clamps this voltage at the clamp voltage (e.g. Vzd=6 V).

The clamp voltage Vzd of the clamping section 222 is supplied to the trigger signal output section 144 of the trigger section 140, and therefore the trigger signal Vt becomes the clamp voltage Vzd. Furthermore, the clamp voltage Vzd of the clamping section 222 causes the switch section 226 to be in the ON state, and therefore the capacitor 210 is charged to a constant voltage (e.g. Vcapmax). Here, in a case where the switch section 226 includes a transistor and the threshold voltage of this transistor is Vthm (e.g. 1 V), Vcapmax=Vzd−Vthm=5 V.

When the control signal Vin becomes the high potential (e.g. 5 V), the gate potential Vg becomes the high potential, thereby switching the power semiconductor element 110 to the ON state, the collector current Ic begins increasing, and the collector voltage Vc begins increasing after becoming substantially 0 V. Furthermore, the trigger section 140 outputs the trigger signal with the low potential, and the reset section 150 outputs the reset signal Vr with the high potential.

Since the trigger section 140 outputs the trigger signal, the switch section 226 enters the OFF state and the capacitor 210 is caused to discharge by the discharging section 230. Therefore, the potential Vcap of the capacitor 210 drops from Vcapmax. In a case where the control signal Vin becomes the low potential before the potential Vcap of the capacitor 210 drops to the threshold value of the inverter 240 (e.g. Vthinv), the control signal Vin is switched to the low potential during an interval shorter than the timer time T after the control signal Vin became the high potential.

In this case, this low potential becomes the gate potential Vg of the power semiconductor element 110, and therefore the power semiconductor element 110 is switched to the OFF state. In this way, the ignition operation described in FIG. 1 is performed, the collector current IC returns to substantially 0 A, and the collector voltage Vc returns to the output potential of the power source. As a part of the ignition operation, the collector voltage Vc returns to the output potential of the power source after instantaneously becoming a high voltage. Furthermore, the trigger signal Vt becomes the clamp voltage Vzd and the capacitor 210 is charged to the potential Vcapmax. The above describes the operation of the switch apparatus 200 in the range shown in FIG. 8 where the control signal Vin is "normal".

The following describes an example in which the high potential state of the control signal Vin continues beyond the timer time T. In this case, until reaching the state where the control signal Vin has become the high potential, the power semiconductor element 110 is switched to the ON state, the collector current Ic begins increasing, and the collector voltage Vc begins increasing after becoming substantially 0 V, as already described above. Furthermore, the trigger section 140 outputs the trigger signal, the reset section 150 outputs the reset signal Vr, and the potential Vcap of the capacitor 210 is reduced.

When the high potential state of the control signal Vin continues, the discharging section 230 continues the discharge of the capacitor 210 and the potential Vcap of the capacitor 210 continues being reduced. When the potential Vcap of the capacitor 210 is reduced to the threshold value Vthinv of the inverter 240, the input of the inverter 240 becomes the low potential, and therefore the inverter 240 outputs the timer signal with the high potential. In other words, in a case where the collector current Ic continues to flow, the inverter 240 outputs the timer signal Vs when the timer time T has passed from when the control signal Vin became the high potential, in order to prevent damage or the like from occurring in the switch apparatus 200 and components such as the ignition coil 30 connected to the switch apparatus 200.

The latch section 160 latches the timer signal Vs and outputs the cutoff signal, and the cutoff section 120 sets the gate potential Vg to the low potential. In other words, the cutoff section 120 pulls down the gate of the power semiconductor element 110 to set the power semiconductor element 110 to the OFF state, in response to the voltage of the capacitor 210 becoming lower than the threshold voltage Vthinv. In this way, the ignition operation described in FIG. 1 is performed, the collector current Ic returns to substantially 0 A, and the collector voltage Vc returns to the output voltage of the power source. In a case where the control signal Vin continues at the high potential, the trigger section 140 continues to output the low potential, and therefore the switch section 226 continues being in the OFF state and the potential Vcap of the capacitor 210 continues being reduced.

After the collector current Ic and the collector voltage Vc have returned to the original values, when the control signal Vin becomes the low potential, the power source supply to the latch section 160 is cut off, and therefore the cutoff signal becomes the low potential. Furthermore, the power source supply to the trigger section 140 is also cut off, and therefore the switch section 226 is switched to the ON state and the capacitor 210 is charged. The above describes the operation of the switch apparatus 200 in the range shown in FIG. 8 where the control signal Vin is "ON fixed".

As described above, the switch apparatus 200 according to the present embodiment can detect that the state of current flowing through the power semiconductor element 110 has continued for a time greater than or equal to the timer time T, and switch the power semiconductor element 110 to the OFF state. Furthermore, the switch apparatus 200 can control the power semiconductor element 110 without using the timer circuit 130 described in FIG. 1. In other words, the switch apparatus 200 can function as a timer circuit that operates stably while realizing a smaller circuit size. Accordingly, by manufacturing the switch apparatus 200 as an integrated circuit and forming this on one chip, it is possible to provide an ignitor that has a reduced chip size.

Figure 9:
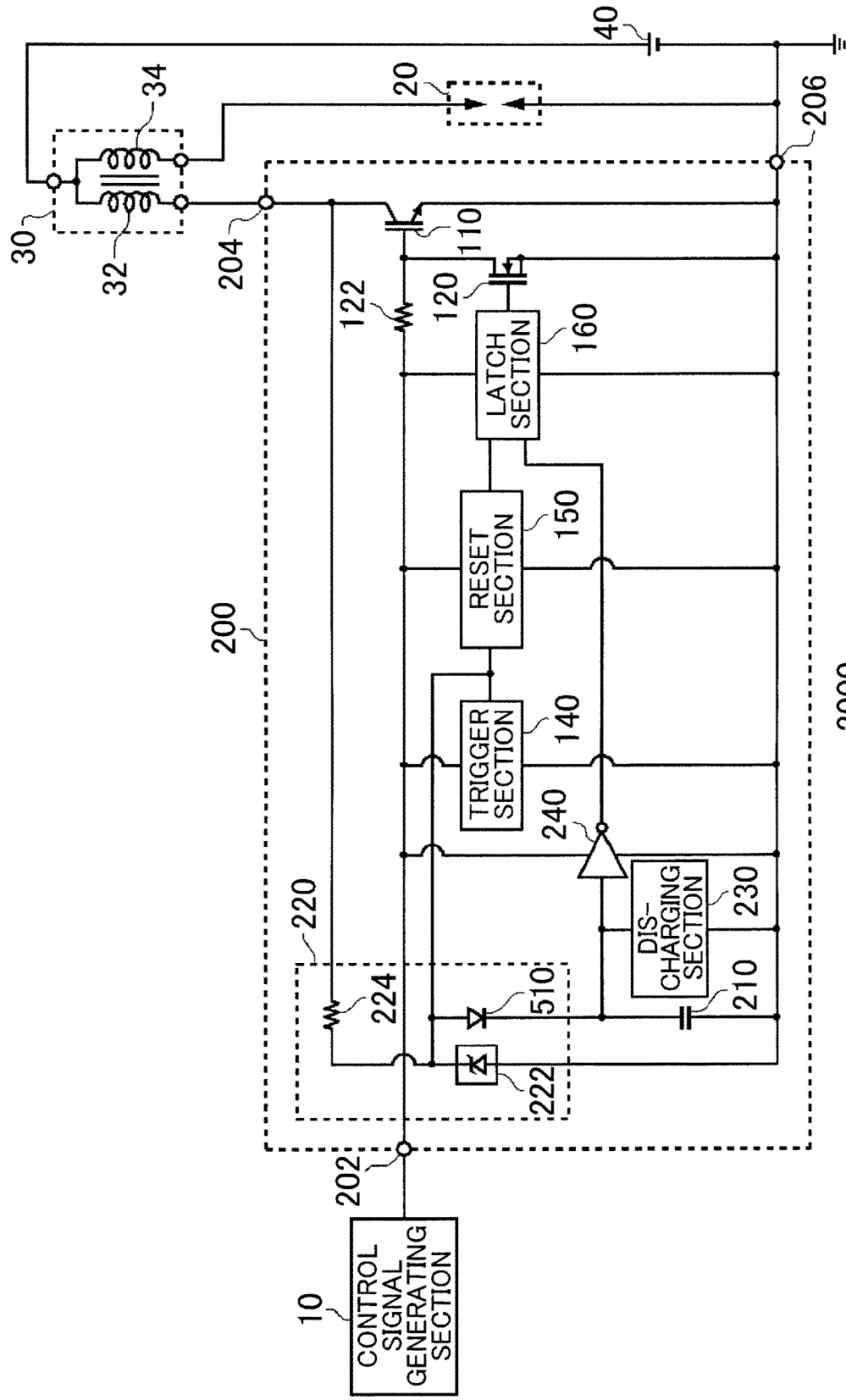
FIG. 9 shows an exemplary configuration of an ignition apparatus 2000 including a first modification of the switch apparatus 200 according to the present embodiment.

FIG. 9 shows an exemplary configuration of an ignition apparatus 2000 including a first modification of the switch apparatus 200 according to the present embodiment. In the ignition apparatus 2000 shown in FIG. 9, components that have substantially the same operation as components of the ignition apparatus 2000 according to the embodiment shown in FIG. 5 are given the same reference numerals and descriptions thereof are omitted. The switch apparatus 200 according to the first modification includes a rectifying element 510 in the charging section 220. The rectifying element 510 is a diode, for example.

The rectifying element 510 is connected between the first resistor 224 and the capacitor 210, and is connected as a circuit causing current to flow in one direction from the first terminal 204 toward the capacitor 210. The anode terminal of the rectifying element 510 is connected to the first resistor 224 and the cathode terminal of the rectifying element 510 is connected to the other terminal of the capacitor 210. Accordingly, the rectifying element 510 can perform substantially the same operation as the switch section 226 described in FIG. 5, and the switch apparatus 200 according to the first modification can perform substantially the same operation as the switch apparatus 200 described in FIGS. 5 to 8. Therefore, the switch apparatus 200 according to the first modification need not include the switch section 226.

Figure 10:
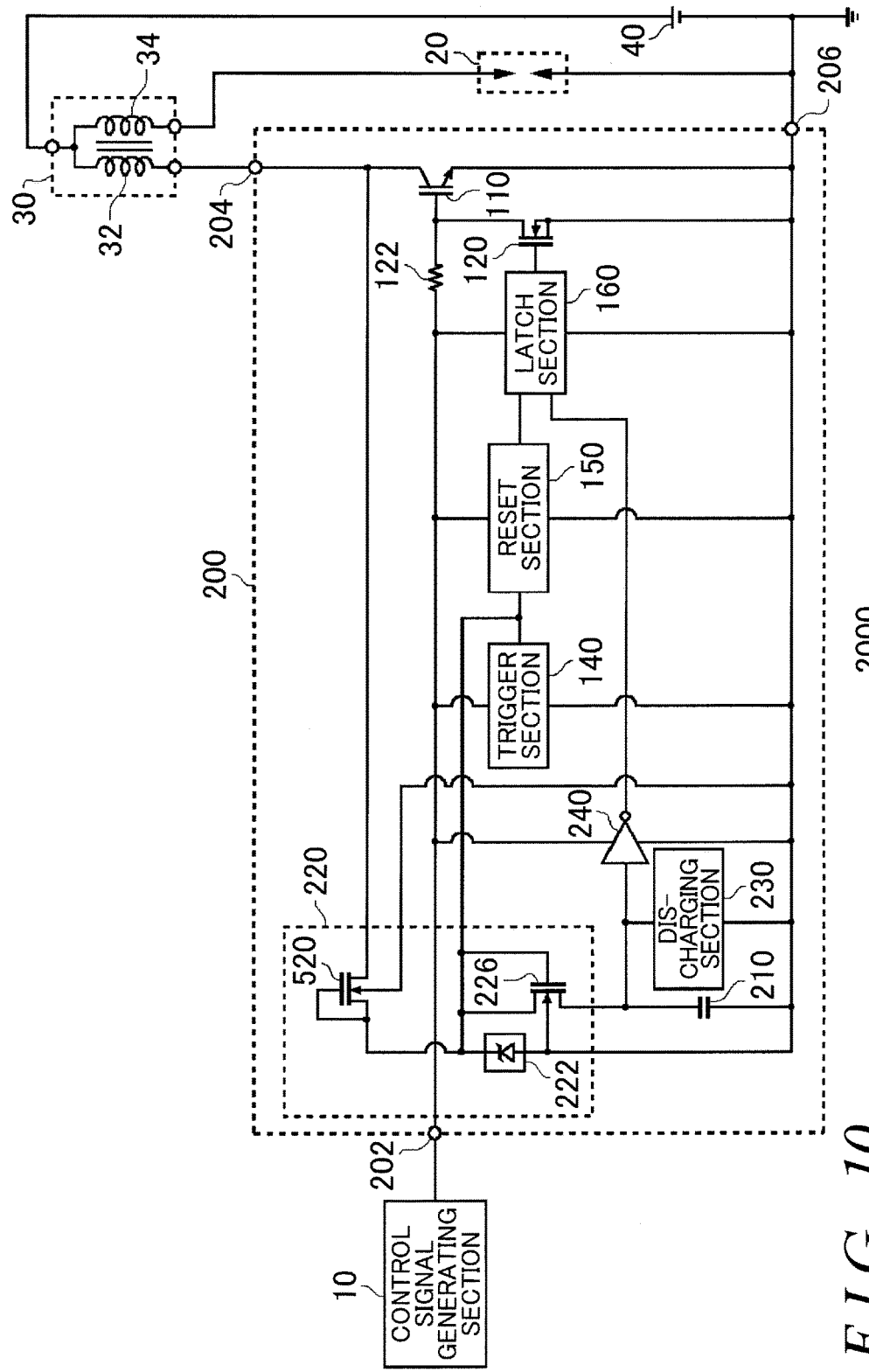
FIG. 10 shows an exemplary configuration of an ignition apparatus 2000 including a second modification of the switch apparatus 200 according to the present embodiment.

FIG. 10 shows an exemplary configuration of an ignition apparatus 2000 including a second modification of the switch apparatus 200 according to the present embodiment. In the ignition apparatus 2000 shown in FIG. 10, components that have substantially the same operation as components of the ignition apparatus 2000 according to the embodiment shown in FIG. 5 are given the same reference numerals and descriptions thereof are omitted. The switch apparatus 200 according to the second modification includes a switch element 520 in the charging section 220.

The switch element 520 is connected between the first terminal 204 and the switch section 226, and is connected as a circuit for limiting the current flowing from the first terminal 204 to the gate terminal of the switch section 226. The drain terminal of the switch element 520 is connected to the first terminal 204, the source terminal of the switch element 520 is connected to the gate terminal of the switch section 226, and the gate terminal of the switch element 520 is connected to the source terminal of the switch element 520. In this case, the switch element 520 may be a depression (normally-ON) MOSFET.

The switch element 520 causes the flow of a current proportional to the drain-source potential (i.e. drain-gate potential), and therefore functions as a resistor. Accordingly, the switch apparatus 200 according to the second modification may include the switch element 520 instead of the first resistor 224. Furthermore, when the drain potential rises to approximately 40 V, the current flowing between the drain and the source of the switch element 520 due to saturation becomes approximately 100 µA, for example. Therefore, it is possible to prevent an excessive current from flowing through the clamping section 222. In the manner described above, the switch element 520 functions as the first resistor 224, and therefore the switch apparatus 200 according to the second modification can perform substantially the same operation as the switch apparatus 200 described in FIGS. 5 to 8. Furthermore, the rectifying element 510 may be included instead of the switch section 226, as described in the first modification.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A switch apparatus comprising:
a power semiconductor element connected between a first terminal on a high potential side and a second terminal on a low potential side;
a capacitor;
a charging circuit that charges the capacitor for at least a portion of an interval during which the power semiconductor element is OFF;
a discharging circuit that causes the capacitor to discharge, in response to the power semiconductor element becoming ON; and
a cutoff circuit that sets the power semiconductor element to an OFF state, in response to a voltage of the capacitor becoming lower than a threshold voltage; and
a latch that is reset by a trigger signal and set in response to a timer signal indicating that the voltage of the capacitor has become lower than the threshold voltage, wherein
the cutoff circuit sets the power semiconductor element to an OFF state in response to the latch being set.

2. The switch apparatus according to claim 1, wherein the charging circuit charges the capacitor with a voltage from the first terminal.

3. The switch apparatus according to claim 2, wherein the charging circuit includes a clamping circuit connected in parallel with the capacitor between the first terminal and a reference potential, and
the capacitor is charged with a voltage clamped by the clamping circuit.

4. The switch apparatus according to claim 3, wherein the clamping circuit includes a Zener diode connected in parallel with the capacitor between the first terminal and the reference potential.

5. The switch apparatus according to claim 4, wherein the charging circuit further includes a first resistor connected between the first terminal and a terminal on the first terminal side of the capacitor and clamping circuit.

6. The switch apparatus according to claim 2, further comprising:
a trigger circuit that outputs the trigger signal, when in response to a control signal for controlling the power semiconductor element, the trigger signal becoming a higher voltage than a reference voltage, wherein
the charging circuit further includes a switch circuit that cuts off a connection between the first terminal and the capacitor, in response to the trigger signal.

7. The switch apparatus according to claim 1, wherein the cutoff circuit pulls down a gate of the power semiconductor element, in response to the voltage of the capacitor becoming lower than the threshold voltage.

8. The switch apparatus according to claim 1, wherein the switch apparatus is an ignitor that controls a current flowing through an ignition coil connected to the first terminal, in response to a control signal for controlling the power semiconductor element.

9. A switch apparatus comprising:
a power semiconductor element connected between a first terminal on a high potential side and a second terminal on a low potential side;
a capacitor;
a charging circuit that charges the capacitor for at least a portion of an interval during which the power semiconductor element is OFF;
a discharging circuit that causes the capacitor to discharge, in response to the power semiconductor element becoming ON; and
a cutoff circuit that sets the power semiconductor element to an OFF state, in response to a voltage of the capacitor becoming lower than a threshold voltage;
a trigger circuit that outputs a trigger signal, when in response to a control signal for controlling the power semiconductor element, the trigger signal becoming a higher voltage than a reference voltage; and
a latch that is reset by the trigger signal and set in response to a timer signal indicating that the voltage of the capacitor has become lower than the threshold voltage, wherein
the charging circuit further includes a switch circuit that cuts off a connection between the first terminal and the capacitor, in response to the trigger signal,
the cutoff circuit sets the power semiconductor element to an OFF state in response to the latch being set, and
the charging circuit charges the capacitor with a voltage from the first terminal.

10. The switch apparatus according to claim 9, wherein the trigger circuit and the latch operate using the control signal as a power source.

11. A switch apparatus comprising:
a power semiconductor element connected between a first terminal on a high potential side and a second terminal on a low potential side;
a capacitor;
a charging circuit that charges the capacitor for at least a portion of an interval during which the power semiconductor element is OFF;
a discharging circuit that causes the capacitor to discharge, in response to the power semiconductor element becoming ON; and
a cutoff circuit that sets the power semiconductor element to an OFF state, in response to a voltage of the capacitor becoming lower than a threshold voltage; and
a latch that is reset by a trigger signal and set in response to a timer signal indicating that the voltage of the capacitor has become lower than the threshold voltage, wherein
the cutoff circuit sets the power semiconductor element to an OFF state in response to the latch being set, and
the trigger that generates the trigger signal and the latch, operate using a control signal for controlling the power semiconductor element as a power source.

12. The switch apparatus according to claim 11, wherein the charging circuit charges the capacitor with a voltage from the first terminal.

13. The switch apparatus according to claim 12, wherein the charging circuit includes a clamping circuit connected in parallel with the capacitor between the first terminal and a reference potential, and
the capacitor is charged with a voltage clamped by the clamping circuit.

14. The switch apparatus according to claim 13, wherein the clamping circuit includes a Zener diode connected in parallel with the capacitor between the first terminal and the reference potential.

15. The switch apparatus according to claim 14, wherein
the charging circuit further includes a first resistor connected between the first terminal and a terminal on the first terminal side of the capacitor and clamping circuit.

16. The switch apparatus according to claim 12, further comprising:
a trigger circuit that outputs the trigger signal, when in response to the control signal for controlling the power semiconductor element, the trigger signal becoming a higher voltage than a reference voltage, wherein
the charging circuit further includes a switch circuit that cuts off a connection between the first terminal and the capacitor, in response to the trigger signal.

17. The switch apparatus according to claim 11, wherein the cutoff circuit pulls down a gate of the power semiconductor element, in response to the voltage of the capacitor becoming lower than the threshold voltage.

18. The switch apparatus according to claim 11, wherein the switch apparatus is an ignitor that controls a current flowing through an ignition coil connected to the first terminal, in response to the control signal for controlling the power semiconductor element.

\* \* \* \* \*